US008221960B2

(12) United States Patent
Balbinot et al.

(10) Patent No.: US 8,221,960 B2
(45) **Date of Patent: *Jul. 17, 2012**

(54) ON-PRESS DEVELOPMENT OF IMAGED ELEMENTS

(75) Inventors: Domenico Balbinot, Osterode am Harz (DE); Mathias Jarek, Northeim (DE)

(73) Assignee: Eastman Kodak Company, Rochester, NY (US)

( * ) Notice: Subject to any disclaimer, the term of this patent is extended or adjusted under 35 U.S.C. 154(b) by 445 days.

This patent is subject to a terminal disclaimer.

(21) Appl. No.: 12/477,226

(22) Filed: Jun. 3, 2009

(65) Prior Publication Data

US 2010/0310840 A1 Dec. 9, 2010

(51) Int. Cl.

| | |
|---|---|
| ***G03F 7/00*** | (2006.01) |
| ***G03F 7/26*** | (2006.01) |
| ***G03C 1/00*** | (2006.01) |
| ***B41F 1/18*** | (2006.01) |

(52) U.S. Cl. ..................... 430/302; 430/138; 430/281.1; 430/286.1; 101/450.1; 101/453; 101/463.1

(58) Field of Classification Search ............... 430/270.1, 430/300–309, 138, 281.1; 101/450.1, 454, 101/463.1

See application file for complete search history.

(56) References Cited

U.S. PATENT DOCUMENTS

| | | | |
|---|---|---|---|
| 5,609,980 | A | 3/1997 | Matthews et al. |
| 6,030,750 | A | 2/2000 | Vermeersch et al. |
| 6,110,644 | A | 8/2000 | Vermeersch et al. |
| 6,218,073 | B1 | 4/2001 | Shimizu et al. |
| 6,509,133 | B1 | 1/2003 | Watanabe et al. |
| 6,627,380 | B2 | 9/2003 | Saito et al. |
| 6,692,890 | B2 | 2/2004 | Huang et al. |
| 6,805,052 | B2 | 10/2004 | Aert et al. |
| 7,297,467 | B2 | 11/2007 | Vander Aa |
| 2008/0229955 | A1 | 9/2008 | Yu |

FOREIGN PATENT DOCUMENTS

| | | |
|---|---|---|
| EP | 0 515 145 | 7/1996 |
| EP | 0 770 494 | 5/2000 |
| EP | 0 774 364 | 10/2000 |
| EP | 0 770 496 | 3/2002 |
| EP | 0 839 647 | 3/2002 |
| EP | 0 770 495 | 6/2002 |
| EP | 1 092 555 | 8/2002 |
| EP | 1 219 416 | 8/2004 |
| EP | 1 524 113 | 4/2005 |
| EP | 1 642 714 | 10/2007 |
| JP | 2001 030645 A | 2/2001 |
| JP | 2006 240170 A | 9/2006 |
| WO | WO 2008/046775 | 4/2008 |

OTHER PUBLICATIONS

U.S. Appl. No. 12/412,400, filed Mar. 27, 2009, Mathias Jarek et al.
U.S. Appl. No. 12/017,366, filed Jan. 22, 2008 by Mathias Jarek.

*Primary Examiner* — Cynthia Kelly
*Assistant Examiner* — Connie P Johnson
(74) *Attorney, Agent, or Firm* — J. Lanny Tucker

(57) ABSTRACT

Images can be provided using a method comprising thermally imaging a negative-working imageable element to provide an imaged element with exposed regions and non-exposed regions, the exposed regions consisting essentially of coalesced core-shell particles, and developing the imaged element on-press to remove only the non-exposed regions using a lithographic printing ink, fountain solution, or both. The imageable element comprises a single thermally-sensitive imageable layer consisting essentially of an infrared radiation absorbing compound and core-shell particles that coalesce upon thermal imaging. The core of the core-shell particles is composed of a hydrophobic thermoplastic polymer, the shell of the core-shell particles is composed of a hydrophilic polymer that is covalently bonded to the core hydrophobic thermoplastic polymer, and the thermally-sensitive imageable layer comprises less than 10 weight % of free polymer.

11 Claims, No Drawings

ON-PRESS DEVELOPMENT OF IMAGED ELEMENTS

FIELD OF THE INVENTION

This invention relates to a method of imaging and on-press development of negative-working imageable elements that use thermally coalesceable core-shell particles in the imageable layer. The imaged elements can be developed on-press using a lithographic printing ink, fountain solution, or both.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced.

Imageable elements useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers that image in response to signals from a digital copy of the image in a computer a platesetter. This "computer-to-plate" technology has generally replaced the former technology where masking films were used to image the elements.

Thermal imaging has especially become important with digital imaging systems because of their stability to ambient light. The elements are designed to be sensitive to heat or infrared radiation and can be exposed using thermal heads or more usually, infrared laser diodes. Heat that is generated from this exposure can be used in a number of ways, for example, ablation to physical remove imaged areas, polymerization of photosensitive compositions, insolubilization by crosslinking polymers, rendering polymers alkaline solution soluble, decomposition, or coagulation of thermoplastic particles. Most of these imaging techniques require the use of alkaline developers to remove exposed (positive-working) or non-exposed (negative-working) regions of the imaged layer(s).

Thermally meltable or fusible particles having surface functional groups have been used in imageable elements as described for example, in U.S. Pat. Nos. 6,218,073 (Shimizu et al.), 6,509,133 (Watanabe et al.), and 6,627,380 (Saito et al.). Other meltable polymeric particles are described in U.S. Pat. No. 6,692,890 (Huang et al.).

Coalesceable thermoplastic polymeric particles dispersed within hydrophilic binders in imageable elements are described, for example, in U.S. Pat. Nos. 6,030,750 (Vermeersch et al.) and 6,110,644 (Vermeersch et al.).

Core-shell particles are used in imageable layers according to U.S. Pat. No. 5,609,980 (Matthews et al.) and coalesce upon thermal imaging. The shell of the particles is soluble or swellable in aqueous media.

EP 514,145A1 (Matthews et al.) describes thermally-sensitive imageable elements containing heat-softenable core-shell particles in the imaging layer. Such particles coalesce upon heating and the non-coalesced particles are removed using an alkaline developer. The shells of these particles are specifically non-water soluble. A similar composition is described in EP 1,642,714A1 (Wilkinson et al.) in which the core-shell particles are dispersed within a hydrophilic binder. Non-exposed particles are removed using a gum solution instead of an alkaline developer.

Copending and commonly assigned U.S. Ser. No. 12/017,366 (filed Jan. 22, 2008 by Jarek) describes negative-working imageable elements containing coalesceable core-shell particles that are developed off-press using water or alkaline solutions.

As noted in several references, coalesceable core-shell particles are known for use in imageable elements for some time, but those particles are usually dispersed in hydrophilic binders. Moreover, imaged elements having such particles often must be developed in alkaline solutions such as common developers or with gum solutions. There is a need to provide imageable elements with coalesceable particles that can be developed on-press.

SUMMARY OF THE INVENTION

Our invention provides a method of providing an image comprising:

A) thermally imaging a negative-working imageable element to provide an imaged element with exposed regions and non-exposed regions, the exposed regions consisting essentially of coalesced core-shell particles, and B) developing the imaged element on-press to remove only the non-exposed regions using a lithographic printing ink, fountain solution, or both, the imageable element comprising a hydrophilic substrate, and having thereon a single thermally-sensitive imageable layer consisting essentially of an infrared radiation absorbing compound and core-shell particles that coalesce upon thermal imaging, wherein the core of the core-shell particles is composed of a hydrophobic thermoplastic polymer, the shell of the core-shell particles is composed of a hydrophilic polymer that is covalently bonded to the core hydrophobic thermoplastic polymer, wherein the thermally-sensitive imageable layer comprises less than 10 weight % of free polymer.

This invention also provides a lithographic printing plate having an aluminum-containing substrate comprising a hydrophilic surface that is prepared by the method of this invention.

We have discovered how to design negative-working imageable elements that contain coalesceable particles and can also be processed or developed on-press. This is possible because of the particular coalesceable particles being used, that is, certain core-shell particles, in the imageable layer.

DETAILED DESCRIPTION OF THE INVENTION

Definitions

Unless the context indicates otherwise, when used herein, the terms "imageable element", "negative-working imageable element", and "lithographic printing plate precursor" are meant to be references to embodiments useful in the practice of the present invention.

In addition, unless the context indicates otherwise, the various components described herein such as "core-shell particles", "infrared radiation absorbing compound", and similar terms also refer to mixtures of such components. Thus, the use of the article "a" or "an" is not necessarily meant to refer to only a single component.

By "single-layer" imageable element, we mean an imageable element of this invention that has only a single layer needed for providing an image. The core-shell particles (defined below) would be located in this single imageable layer that is usually the outermost layer. However, such elements may comprise additional non-imaging layers on either side of the substrate and underneath the imageable layer.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Core-Shell Particles

The core-shell particles used in the practice of this invention typically have a hydrophobic polymer core containing one or more hydrophobic polymers. The useful hydrophobic polymers are "thermoplastic" meaning that they generally have a glass transition temperature of at least 40° C. or typically of at least 50° C. and thus can be melted or coalesced during thermal imaging that provides heating at a suitable temperature above the glass transition temperature. Useful hydrophobic thermoplastic polymers include, but are not limited to polystyrenes, poly(meth)acrylates, polymethylenelactones, poly(meth)acrylonitriles, polyvinyl chloride, polyvinyl esters, polysulfones, polycarbonates, polyurethanes, and polyamides. Representative polymers in these classes include polystyrene, poly(methyl methacrylate), poly(methyl acrylate), polymethylenelactone, poly[(meth)acrylonitrile], and polyvinyl chloride.

The core generally has an average diameter of from about 20 to about 120 nm and typically from about 30 to about 100 nm, and the volume of the core polymer(s) comprises from about 75 to about 95% of the particle volume.

The shell of the useful core-shell particles is composed of one or more hydrophilic polymers that have reactive groups that can bond with the hydrophobic polymer(s) of the core. In some instances, the shell polymers are "hydrophilic" in the sense that they are more water-loving than the core polymer (s). For example, the shell polymers can contain acidic groups, such as carboxy, sulfo, or phospho groups that have been partially or fully neutralized with a suitable base such as a hydroxide. For example, the shell polymers can contain carboxy groups and from about 5 to about 80 mol % of the carboxy groups have been neutralized with sodium hydroxide, potassium hydroxide, or ammonium hydroxide. Thus, the shell polymer(s) can be derived at least in part from one or more (meth)acrylic acids, (meth)acrylamides, (meth)acryloyltetrazoles, (meth)acrylates, ethylene glycol (meth)acrylate phosphates, phosphonated (meth)acrylates, cyclic urea methacrylate (Plex-O 6850) vinyl phosphonic acid, diethylaminoethyl(meth)acrylamides, and sulfonated (meth)acrylates. Such polymers can be used, for example, in combination with one or more (meth)acrylamides.

In some embodiments, the shell comprises a polymer comprising recurring units derived from a (meth)acrylamide, vinyl imidazole, N-(meth)acryloyltetrazole, vinyl pyrrolidone, or mixtures thereof.

In other embodiments, the shell polymer is derived from one or more of (meth)acrylic acid, sulfonated (meth)acrylate, phosphate (meth)acrylate, vinyl phosphonic acid, or mixtures thereof and, and one or more (meth)acrylamides.

It is desirable that the hydrophilic shell polymer be covalently bonded to the hydrophobic core polymer through reactive (meth)acrylic acid groups in the hydrophobic core polymer.

The shell thickness is generally from about 1 to about 10 nm and generally comprises from about 5 to about 25% of the volume of the core-shell particles, on average (some particles may be less than 5% and others more than 25%, but the average volume is within the noted range). The shell is believed to entirely cover the core of most or all particles, but there may be some particles in which the shell only partially covers the core.

The resulting core-shell particles generally have an average particle size of from about 25 to about 150 nm or from about 35 to about 110 nm.

The core-shell particles are generally prepared as dispersions as described for the Examples below. Generally, the core polymer is formed by emulsion or suspension polymerization using known reactants and conditions to provide an initial dispersion. After a suitable period of reaction, monomers and free radical initiators are added to the dispersion to form the shell polymer(s) around the individual polymer cores. The core-shell dispersions may be naturally stable from sedimentation, or surfactants can be added to stabilize the core-shell particles for a suitable time.

Some polymers used to form the shells may be highly water soluble, and so the resulting dispersions may also include some free polymer suspended in the reaction medium.

In some embodiments, either the shell or the core of the core-shell particles is at least partially crosslinked using any suitable crosslinking chemistry.

Other polymers used to form the shells are less water soluble and very little or no free polymer is suspended in the reaction medium. Such polymers are useful because removal of free polymer is not necessary.

Imageable Elements

The imageable elements include the coalesceable core-shell particles described above in the single and outermost imageable layer.

In general, single-layer imageable elements are formed by suitable application of an imageable layer formulation containing the coalesceable core-shell particles to a suitable substrate to form an imageable layer. This substrate is usually treated or coated in various ways as described below prior to application of the formulation. The substrate can be treated to provide an "interlayer" for improved adhesion or hydrophilicity, and the single imageable layer is applied over the interlayer.

The substrate generally has a hydrophilic surface, or at least a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support having a hydrophilic surface that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press or a sleeve that is incorporated onto a press cylinder. The use of such imaged cylinders is described for example in U.S. Pat. No. 5,713,287 (Gelbart).

The imageable element also includes one or more radiation absorbing compounds. While these compounds can be sensitive to any suitable energy form (for example, UV or visible radiation), they are usually sensitive to infrared radiation and thus, the radiation absorbing compounds can be infrared radiation absorbing compounds ("IR absorbing compounds") that absorb radiation from about 700 to about 1400 nm and typically from about 700 to about 1200 nm.

Examples of suitable IR dyes include but are not limited to, azo dyes, squarylium dyes, triarylamine dyes, thiazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. Nos. 4,973,572 (DeBoer), 5,208,135 (Patel et al.), 5,244,771 (Jandrue Sr. et al.), and 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao). A general description of one class of suitable cyanine dyes is shown by the formula in paragraph 0026 of WO 2004/101280 (Munnelly et al.).

Near infrared absorbing cyanine dyes are also useful and are described for example in U.S. Pat. Nos. 6,309,792 (Hauck et al.), 6,264,920 (Achilefu et al.), 6,153,356 (Urano et al.), 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The radiation absorbing compound is generally present in the imageable element in an amount sufficient to render the thermally-sensitive imageable layer insoluble to an aqueous developer after exposure to appropriate radiation. This amount is generally at least 1% and up to 30 weight % and typically from about 5 to about 30 weight % (based on total dry imageable layer weight). The particular amount needed for this purpose would be readily apparent to one skilled in the art, depending upon the specific compound used and the properties of the alkaline developer to be used. In most embodiments, the radiation absorbing compound is present in the single imageable layer. Alternatively or additionally, radiation absorbing compounds may be located in a separate layer that is in thermal contact with the single imageable layer. Thus, during imaging, the action of the radiation absorbing compound can be transferred to the imageable layer without the compound originally being incorporated into it.

The imageable layer includes the core-shell particles described above in a sufficient amount generally to provide at least 50 weight %, and typically from about 60 to about 95 weight % of the total imageable layer dry weight.

An imageable layer comprising the core-shell particles (usually in an aqueous dispersion), one or more radiation-sensitive compounds and any other additives (described below), can be prepared by dispersion the components in a suitable solvent medium (described below).

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

Generally, the imageable layer is free of polymers besides those forming the core-shell particles, as the shell of the coalesceable core-shell particles typically acts as the binder in the layer once solvents are removed due to the particular shell polymers in the particles. Thus, free polymers are generally present in an amount of less than 10%, typically less than 5%, based on the dry imageable layer weight.

In some embodiments, the thermally-sensitive imageable layer is soluble or dispersible in water.

The single-layer imageable element can be prepared by applying the layer formulation over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single imageable layer can be from about 0.4 to about 2 $g/m^2$ and typically from about 0.5 to about 1 $g/m^2$.

The selection of solvents used to coat the imageable layer formulation depends upon the nature of the core-shell polymeric materials and other components in the formulations. Generally, the imageable layer formulation is coated out of acetone, methanol, or an aqueous solution containing methanol, ethanol, isopropyl alcohol, n-propanol, n-butanol, and mixtures thereof using conditions and techniques well known in the art.

Intermediate drying steps may be used between applications of the various layer formulations to remove solvent(s) before coating other formulations. Drying steps may also help in preventing the mixing of the various layers.

Imaging and Development

The single-layer imageable elements can have any useful form including, but not limited to, printing plate precursors, printing cylinders, printing sleeves (solid or hollow cores) known as rotary printing members, and printing tapes (including flexible printing webs). For example, the imageable members can be printing plate precursors useful for providing lithographic printing plates having hydrophilic substrates.

During use, the single-layer imageable elements are exposed to a suitable source of thermal energy such as infrared radiation, depending upon the radiation absorbing compound present in the element, for example at a wavelength of from about 700 to about 1400 nm. In some embodiments, imaging can be carried out using an infrared laser at a wavelength of from about 700 to about 1400 nm and typically from about 700 to about 1200 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 100 to about 1500 $mJ/cm^2$, and typically from about 100 to about 400 $mJ/cm^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed)

and non-imaged (non-exposed) regions. Developing the imaged element on-press (described below) removes the non-exposed regions of the imageable layer and the underlying portions of any underlayers and exposes the hydrophilic surface of the substrate. Core-shell particles coalesced from the thermal imaging remain in the exposed regions. Thus, the imageable elements are "negative-working" (for example, negative-working lithographic printing plate precursors). The non-exposed (or non-imaged) regions of the hydrophilic surface repel ink while the exposed (or imaged) regions remaining in the element accept ink.

During "on-press" development, the imaged element is directly mounted onto a printing press wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The following embodiments are representative of those provided by the present invention.

Embodiment 1

A method of providing an image comprising:

A) thermally imaging a negative-working imageable element to provide an imaged element with exposed regions and non-exposed regions, the exposed regions consisting essentially of coalesced core-shell particles, and B) developing the imaged element on-press to remove only the non-exposed regions using a lithographic printing ink, fountain solution, or both, the imageable element comprising a hydrophilic substrate, and having thereon a single thermally-sensitive imageable layer consisting essentially of an infrared radiation absorbing compound and core-shell particles that coalesce upon thermal imaging, wherein the core of the core-shell particles is composed of a hydrophobic thermoplastic polymer, the shell of the core-shell particles is composed of a hydrophilic polymer that is covalently bonded to the core hydrophobic thermoplastic polymer, wherein the thermally-sensitive imageable layer comprises less than 10 weight % of free polymer.

Embodiment 2

The method of embodiment 1 wherein the imageable layer comprises less than 5 weight % of free polymeric binder.

Embodiment 3

The method of embodiment 1 or 2 wherein the core hydrophobic thermoplastic polymer has a glass transition temperature greater than 40° C.

Embodiment 4

The method of any of embodiments 1 to 3 wherein the core hydrophobic thermoplastic polymer comprises at least one polymer that is a polystyrene, poly(meth)acrylates, polymethylenelactone, polyvinyl chloride, poly(meth)acrylonitriles, polyvinyl ester, polysulfone, polycarbonate, polyurethane, and polyamide.

Embodiment 5

The method of any of embodiments 1 to 4 wherein the core-shell particles have an average particle size of from about 25 to about 150 nm.

Embodiment 6

The method of any of embodiments 1 to 5 wherein the shell of the core-shell particles has an average thickness of from about 1 to about 10 nm and comprises from about 5 to about 25% of the volume of the core-shell particles, on average, and the core has an average size of from about 20 to about 120 nm.

Embodiment 7

The method of any of embodiments 1 to 6 wherein the shell comprises a polymer derived from one or more of (meth) acrylic acid, (meth)acrylamide, N-(meth)acryloyltetrazole, sulfonated (meth)acrylates, ethylene glycol (meth)acrylate phosphates, phosphonated (meth)acrylates, and diethylaminoethyl(meth)acrylamide.

Embodiment 8

The method of any of embodiments 1 to 7 wherein the hydrophilic shell polymer is covalently bonded to the hydrophobic thermoplastic core polymer through reactive (meth) acrylic acid groups in the hydrophobic core polymer.

Embodiment 9

The method of any of embodiments 1 to 8 wherein the infrared radiation absorbing compound is present in the single thermally-sensitive imageable layer in an amount of from about 5 to about 30%, based on the total imageable layer dry weight.

Embodiment 10

The method of any of embodiments 1 to 9 wherein either the shell or the core of the core-shell particles are at least partially crosslinked.

Embodiment 11

The method of any of embodiments 1 to 10 wherein the imaging is carried out using an infrared laser at a wavelength of from about 700 to about 1400 nm.

Embodiment 12

The method of any of embodiments 1 to 11 wherein the imageable element is a lithographic printing plate precursor and has an aluminum-containing substrate having a hydrophilic surface.

Embodiment 13

A lithographic printing plate having an aluminum-containing substrate comprising a hydrophilic surface that is prepared by the method of any of embodiments 1 to 12.

The following Examples are intended to illustrate the present invention but they are not intended to be limiting any way.

EXAMPLES

1a) Synthesis of Inventive Core-Shell Dispersion

A 2 liter flask was filled with 800.00 g of distilled water in which 12.00 g sodium lauryl sulfate was dissolved. The mixture was heated to 70° C. Then, 119.24 g of styrene, 60.76 g of acrylonitrile, and 2.70 g of potassium peroxodisulfate were added and polymerization was conducted for 2 hours under nitrogen. Acrylic acid (20.00 g) and 2.70 g of potassium peroxodisulfate were then added and polymerization was continued for another 2 hours.

1b) Synthesis of Comparative Polymer Particle Dispersion

A 2 liter flask was filled with 800.00 g of distilled water in which 12.00 g of sodium lauryl sulfate were dissolved. The mixture was heated to 70° C. Then, 180.00 g of styrene and 2.70 g of potassium peroxodisulfate were added and polymerization was continued for 2 hours under nitrogen.

1c) Synthesis of Inventive Core-Shell Dispersion

A 2 liter flask was filled with 800.00 g of distilled water in which 12.00 g of sodium lauryl sulfate were dissolved. The mixture was heated to 70° C. Then, 180.00 g of styrene and 2.70 g of potassium peroxodisulfate were added and polymerization was continued for 2 hours under nitrogen. Ethylene glycol methacrylate phosphate (20 g) and 2.70 g of potassium peroxodisulfate were then added and polymerization was continued for another 2 hours.

1d) Synthesis of Inventive Core-Shell Dispersion

A 2 liter flask was filled with 800.00 g of distilled water in which 12.00 g of sodium lauryl sulfate were dissolved. The mixture was heated to 70° C. Then, 180.00 g of methyl methacrylate and 2.70 g of potassium peroxodisulfate were added and polymerization was continued for 2 hours under nitrogen. Acrylic acid (20 g) and 2.70 g of potassium peroxodisulfate were then added and polymerization was continued for another 2 hours.

2a) Invention Coating Formulation with Core-Shell Particles

The following components were mixed:

0.0784 g of a water-soluble IR dye (S0306, FEW), 2.4300 g of aqueous core-shell particle dispersion (Dispersion 1a), 0.25 g of 2% sodium hydroxide (neutralizes 20% of the COOH groups of the shell polymer).

The resulting formulation was coated onto an aluminum-containing substrate that had been anodized and treated with poly(vinyl phosphonic acid) to provide a coating weight 0.6 $g/m^2$.

2b) Comparative Coating Formulation with Non-Core-Shell Polymer Particles

The following components were mixed:

0.0784 g of a water-soluble IR dye, 2.4300 g of aqueous particle dispersion (Dispersion 1b), 2.2500 g methanol, and 0.25 g of 2% sodium hydroxide.

The resulting formulation was coated on the same aluminum-containing substrate as described above to a coating weight of 0.6 $g/m^2$.

2c) Invention Coating Formulation with Non-Core-Shell Polymer Particles

The following components were mixed:

0.0784 g of a water-soluble IR dye, 2.4300 g of aqueous particle dispersion (Dispersion 1c), 2.2500 g methanol, and 0.25 g of 2% sodium hydroxide.

The resulting formulation was coated on the same aluminum-containing substrate as described above in 2a to a coating weight of 0.6 $g/m^2$.

2d) Invention Coating Formulation with Non-Core-Shell Polymer Particles

The following components were mixed:

0.0784 g of a water-soluble IR dye, 2.4300 g of aqueous particle dispersion (Dispersion 1d), 2.2500 g methanol, and 0.25 g of 2% sodium hydroxide.

The resulting formulation was coated on the same aluminum-containing substrate as described above in 2a to a coating weight of 0.6 $g/m^2$.

After imaging, the elements were mounted onto a printing press and pre-dampened using Sun Chemical S7184/CF01 lithographic printing ink and Böttcher GmbH Fount S-3021 fountain solution.

The resulting invention printing plate formed with formulation 2a exhibited good clean out after 50 sheets, whereas the comparative printing plate with formulation 2b exhibited severe toning even after 100 sheets.

The invention has been described in detail with particular reference to certain preferred embodiments thereof, but it will be understood that variations and modifications can be effected within the spirit and scope of the invention.

The invention claimed is:

1. A method of providing an image comprising:

A) thermally imaging a negative-working imageable element to provide an imaged element with exposed regions and non-exposed regions, said exposed regions consisting essentially of coalesced core-shell particles, and B) developing said imaged element on-press to remove only said non-exposed regions using a lithographic printing ink, fountain solution, or both, said imageable element comprising a hydrophilic substrate, and having thereon a single thermally-sensitive imageable layer consisting essentially of an infrared radiation absorbing compound and core-shell particles that coalesce upon thermal imaging, wherein the core of said core-shell particles is composed of a hydrophobic thermoplastic polymer, the shell of said core-shell particles is composed of a hydrophilic polymer that is covalently bonded to said core hydrophobic thermoplastic polymer, wherein said thermally-sensitive imageable layer comprises less than 10 weight % of free polymer, and the shell of said core-shell particles has an average thickness of from about 1 to about 10 nm and comprises from about 5 to about 25% of the volume of said core-shell particles, on average, and said core has an average size of from about 20 to about 120 nm.

2. The method of claim 1 wherein said imageable layer comprises less than 5 weight % of free polymer.

3. The method of claim 1 wherein said core hydrophobic thermoplastic polymer has a glass transition temperature greater than 40° C.

4. The method of claim 1 wherein said core hydrophobic thermoplastic polymer comprises at least one polymer that is a polystyrene, poly(meth)acrylates, polymethylenelactone, polyvinyl chloride, poly(meth)acrylonitriles, polyvinyl ester, polysulfone, polycarbonate, polyurethane, and polyamide.

5. The method of claim 1 wherein said core-shell particles have an average particle size of from about 25 to about 150 nm.

6. The method of claim 1 wherein said shell comprises a polymer derived from one or more of (meth)acrylic acid, (meth)acrylamide, N-(meth)acryloyltetrazole, sulfonated (meth)acrylates, ethylene glycol (meth)acrylate phosphates, phosphonated (meth)acrylates, and diethylaminoethyl(meth) acrylamide.

7. The method of claim 1 wherein said hydrophilic shell polymer is covalently bonded to said hydrophobic thermoplastic core polymer through reactive (meth)acrylic acid groups in said hydrophobic core polymer.

8. The method of claim 1 wherein said infrared radiation absorbing compound is present in said single thermally-sensitive imageable layer in an amount of from about 5 to about 30%, based on the total imageable layer dry weight.

9. The method of claim 1 wherein either said shell or said core of said core-shell particles are at least partially crosslinked.

10. The method of claim 1 wherein said imaging is carried out using an infrared laser at a wavelength of from about 700 to about 1400 nm.

11. The method of claim 1 wherein said imageable element is a lithographic printing plate precursor and has an aluminum-containing substrate having a hydrophilic surface.

* * * * *